United States Patent
Li et al.

(10) Patent No.: US 9,911,206 B2
(45) Date of Patent: Mar. 6, 2018

(54) TIME EFFICIENT ASL IMAGING WITH SEGMENTED MULTIBAND ACQUISITION

(71) Applicants: Siemens Healthcare GmbH, Erlangen (DE); National Institutes of Health (NIH), Bethesda, MD (US)

(72) Inventors: Xiufeng Li, Shoreview, MN (US); Gregory J. Metzger, Lake Elmo, MN (US); Kamil Ugurbil, Minneapolis, MN (US); Dingxin Wang, Apple Valley, MN (US)

(73) Assignees: Siemens Healthcare GmbH, Erlangen (DE); National Institutes of Health (NIH), Bethesda, MD (US)

( * ) Notice: Subject to any disclaimer, the term of this patent is extended or adjusted under 35 U.S.C. 154(b) by 114 days.

(21) Appl. No.: 14/994,251

(22) Filed: Jan. 13, 2016

(65) Prior Publication Data

US 2016/0203603 A1 Jul. 14, 2016

Related U.S. Application Data

(60) Provisional application No. 62/102,789, filed on Jan. 13, 2015.

(51) Int. Cl.
*G06T 11/00* (2006.01)
*G01R 33/563* (2006.01)
*G01R 33/561* (2006.01)

(52) U.S. Cl.
CPC ...... *G06T 11/003* (2013.01); *G01R 33/56366* (2013.01); *G01R 33/5616* (2013.01)

(58) Field of Classification Search
None
See application file for complete search history.

(56) References Cited

U.S. PATENT DOCUMENTS

| 8,125,484 B2 * | 2/2012 | Gering | G01R 33/546 345/440 |
| 2009/0212773 A1 * | 8/2009 | Feinberg | G01R 33/4818 324/309 |

(Continued)

FOREIGN PATENT DOCUMENTS

EP 1071367 A1 * 1/2001 ............. A61B 5/055

OTHER PUBLICATIONS

Arterial Transit Time Imaging With Flow Encoding Arterial Spin Tagging (FEAST). Jiongjiong Wang, David C. Alsop, Hee Kwon Song, Joseph A. Maldjian, Kathy Tang, Alana E. Salvucci, and John A. Detre. 2003.*

(Continued)

*Primary Examiner* — Delomia L Gilliard

(57) ABSTRACT

A method for generating a perfusion weighted image using ASL with segmented acquisitions includes dividing an anatomical area of interest into slices and performing an EPI acquisition process using an MRI system to acquire a control image dataset representative of the slices. An ASL preparation process is performed using the MRI system to magnetically label protons in arterial blood water upstream from the anatomical area of interest. Following a first time period, a multi-band EPI acquisition process is performed using the MRI system to acquire a first labeled image dataset representative of a first subset of the slices. Following a second time period, another multi-band EPI acquisition process is performed using the MRI system to acquire a second labeled image dataset representative of a second subset of the slices. A perfusion weighted image is generated by subtracting the first and second labeled image dataset from the control image dataset.

21 Claims, 6 Drawing Sheets

(56) References Cited

U.S. PATENT DOCUMENTS

| | | | | |
|---|---|---|---|---|
| 2010/0274117 | A1* | 10/2010 | Gunther | G01R 33/56366 600/410 |
| 2011/0245656 | A1* | 10/2011 | Bammer | G01R 33/56366 600/411 |
| 2012/0195485 | A1* | 8/2012 | Matsuba | A61B 5/0263 382/131 |
| 2013/0085379 | A1* | 4/2013 | Feinberg | A61B 5/0263 600/419 |
| 2013/0204123 | A1* | 8/2013 | Feinberg | A61B 5/055 600/419 |
| 2014/0247046 | A1* | 9/2014 | Grinstead | G01R 33/4835 324/309 |
| 2015/0301133 | A1* | 10/2015 | Priatna | G01R 33/56358 324/309 |
| 2015/0309142 | A1* | 10/2015 | Li | G01R 33/5611 324/309 |
| 2015/0323634 | A1* | 11/2015 | Polimeni | G01R 33/56509 324/309 |
| 2015/0355305 | A1* | 12/2015 | Helle | G01R 33/3854 324/309 |

OTHER PUBLICATIONS

Quantitative Imaging of Perfusion Using a Single Subtraction (QUIPSS and QUIPSS 11). Eric C. Wong, Richard B. Buxton, Lawrence R. Frank. 1998.*

Velocity-Selective Arterial Spin Labeling. Eric C. Wong, Matthew Cronin, Wen-Chau Wu, Ben Inglis, Lawrence R. Frank, and Thomas T. Liu. 2006.*

Moeller, et al., "Multiband multislice GE-EPI at 7 Tesla, with 16-fold acceleration using partial parallel imaging with application to high spatial and temporal whole-brain FMRI"; Magnetic Resonance in Medicine; vol. 63; pp. 1144-1153.

Setsompop, et al., Blipped-Controlled Aliasing in Parallel Imaging (blipped-CAIPI)for simultaneous multi-slice EPI with reduced g-factor penalty, Magn Reson Med. May 2012 ; 67(5): 1210-1224.

Dai, et al., "Continuous Flow Driven Inversion for Arterial Spin Labeling Using Pulsed Radiofrequency and Gradient Fields", Magn Reson Med. Dec. 2008 ; 60(6): 1488-1497.

Wu, et al., "A Theoretical and Experimental Investigation of theTagging Efficiency of Pseudocontinuous Arterial Spin Labeling", Magnetic Resonance in Medicine 58:1020-1027 (2007).

Li, X., et al., "Theoretical and experimental evaluation of multi-band EPI for high-resolution whole brain pCASL Imaging." NeuroImage 106 (2015): 170.

Li, X. et al., "Feasibility of Applying MB EPI PCASL for High-Resolution Whole Brain Perfusion Imaging at 7T", Proceedings of the 21st Annual Meeting of ISMRM, Milano, Italy, 2014:Abstract 0995.

Garcia, et al., "Efficiency of inversion pulses for background suppressed arterial spin labeling." Magnetic resonance in medicine 54.2 (2005): 366-372.

Ye, F. Q., et al., "Noise reduction in 3D perfusion imaging by attenuating the static signal in arterial spin tagging (ASSIST)." Magnetic resonance in medicine: official journal of the Society of Magnetic Resonance in Medicine/Society of Magnetic Resonance in Medicine 44.1 (2000): 92.

Wang, Jiongjiong, et al., "Arterial Transit Time Imaging With Flow Encoding Arterial Spin Tagging (FEAST)." Magnetic Resonance in Medicine 50 (2003): 599-607.

Lu, H., et al., "Determining the longitudinal relaxation time (T1) of blood at 3.0 Tesla." Magnetic resonance in medicine: official journal of the Society of Magnetic Resonance in Medicine/Society of Magnetic Resonance in Medicine 52.3 (2004): 679-682.

Yang, Yihong, et al., "Comparison of 3D BOLD functional MRI with spiral acquisition at 1.5 and 4.0 T." Neuroimage 9.4 (1999):446-451.

Kim, Seong-Gi, "Quantification of relative cerebral blood flow change by flow-sensitive alternating inversion recovery (FAIR) technique: Application to functional mapping." Magnetic Resonance in Medicine 34.3 (1995): 293-301.

Wong, Eric C., et al., "Velocity-selective arterial spin labeling." Magnetic Resonance in Medicine 55.6 (2006): 1334-1341.

Detre, John A., et al., "Perfusion imaging." Magnetic Resonance in Medicine 23.1 (1992): 37-45.

Alsop, David C., and John A. Detre, "Multisection cerebral blood flow MR imaging with continuous arterial spin labeling." Radiology 208.2 (1998): 410-416.

Alsop, David C., et al., "Recommended implementation of arterial spin-labeled perfusion MRI for clinical applications: A consensus of the ISMRM perfusion study group and the European consortium for ASL in dementia." Magnetic Resonance in Medicine 73.1 (2015): 48 pages.

Bokkers, Reinoud PH, et al., "Whole-brain arterial spin labeling perfusion MRI in patients with acute stroke." Stroke 43.5 (2012): 1290-1294.

Cauley, Stephen F., et al., "Interslice leakage artifact reduction technique for simultaneous multislice acquisitions." Magnetic Resonance in Medicine 72.1 (2014): 93-102.

Dai, et al., "Volumetric measurement of perfusion and arterial transit delay using hadamard encoded continuous arterial spin labeling." Magnetic Resonance in Medicine 69.4 (2013): 1014-1022.

Detre, J. A., et al., "Noninvasive MRI evaluation of cerebral blood flow in cerebrovascular disease." Neurology 50.3 (1998): 633-641.

Detre, John A., and Jiongjiong Wang, "Technical aspects and utility of fMRI using BOLD and ASL." Clinical Neurophysiology 113.5 (2002): 621-634.

Feinberg, David A., Alexander Beckett, and Liyong Chen, "Arterial spin labeling with simultaneous multi-slice echo planar imaging." Magnetic Resonance in Medicine 70.6 (2013): 1500-1506.

Feinberg, David A., et al., "Multiplexed echo planar imaging for sub-second whole brain FMRI and fast diffusion imaging." PloS one 5.12 (2010): e15710.

Gai, Neville D., S. Lalith Talagala, and John A. Butman, "Whole-brain cerebral blood flow mapping using 3D echo planar imaging and pulsed arterial tagging." Journal of Magnetic Resonance Imaging 33.2 (2011): 287-295.

Goelman, Gadi, "Two methods for peak RF power minimization of multiple inversion-band pulses." Magnetic resonance in medicine 37.5 (1997): 658-665.

Günther, Matthias, Koichi Oshio, and David A. Feinberg, "Single-shot 3D imaging techniques improve arterial spin labeling perfusion measurements." Magnetic Resonance in Medicine 54.2 (2005): 491-498.

Kim Seong-Gi, and Nikolaos V. Tsekos, "Perfusion imaging by a flow-sensitive alternating inversion recovery (FAIR) technique: application to functional brain imaging." Magnetic Resonance in Medicine 37.3 (1997): 425-435.

Kim, Tae, et al., "Whole brain perfusion measurements using arterial spin labeling with multiband acquisition." Magnetic Resonance in Medicine 70.6 (2013): 1653-1661.

Koopmans, Peter J., et al., "Whole brain, high resolution spin-echo resting state fMRI using PINS multiplexing at 7T." Neuroimage 62.3 (2012): 1939-1946.

Li, Xiufeng, et al.,"Anteroposterior perfusion heterogeneity in human hippocampus measured by arterial spin labeling MRI." NMR in biomedicine 26.6 (2013): 613-621.

Li, Xiufeng, et al. "Hippocampal dysfunction in Gulf War veterans: investigation with ASL perfusion MR imaging and physostigmine challenge." Radiology 261.1 (2011): 218-225.

Moeller, S., et al., "Signal leakage (L-factor) as a measure for parallel imaging performance among simultaneously multi-slice (SMS) excited and acquired signals." Proceedings of the Annual Meeting of the International Society of Magnetic Resonance in Medicine. 2012.

Nielsen, Jon-Fredrik, and Luis Hernandez-Garcia, "Functional perfusion imaging using pseudocontinuous arterial spin labeling with low-flip-angle segmented 3D spiral readouts." Magnetic Resonance in Medicine 69.2 (2013): 382-390.

(56) References Cited

OTHER PUBLICATIONS

Roberts, David A., et al., "Magnetic resonance imaging of the brain: Blood partition coefficient for water: Application to spin-tagging measurement of perfusion." Journal of Magnetic Resonance Imaging 6.2 (1996): 363-366.

Robson, Philip M., et al., "Comprehensive quantification of signal-to-noise ratio and g-factor for image-based and k-space-based parallel imaging reconstructions." Magnetic Resonance in Medicine 60.4 (2008): 895-907.

Setsompop, Kawin, et al., "Improving diffusion MRI using simultaneous multi-slice echo planar imaging." Neuroimage 63.1 (2012): 569-580.

Smith, Stephen M., et al., "Temporally-independent functional modes of spontaneous brain activity." Proceedings of the National Academy of Sciences 109.8 (2012): 3131-3136.

Tan, Huan, et al., "3D Grase Propeller: improved image acquisition technique for arterial spin labeling perfusion imaging." Magnetic Resonance in Medicine 66.1 (2011): 168-173.

Van Essen, David C., et al., "The Human Connectome Project: a data acquisition perspective." Neuroimage 62.4 (2012): 2222-2231.

Wang, et al., "High Resolution T2-weighted Imaging with Whole Brain Coverage at 7 Tesla using Multiband Slice Accelerated Spin Echo", Proceeding of the 20th Annual Meeting of ISMRM, Melbourne, Australia 2012:Abstract 267.

Wong, E., "Optimized phase schedules for minimizing peak RF power in simultaneous multi-slice RF excitation pulses." Proceedings of the 20th Annual Meeting of ISMRM, Melbourne, Australia. 2012.

Wong, Eric C., "Quantifying CBF with pulsed ASL: technical and pulse sequence factors." Journal of Magnetic Resonance Imaging 22.6 (2005): 727-731.

Wong, Eric C., Richard B. Buxton, and Lawrence R. Frank. "A theoretical and experimental comparison of continuous and pulsed arterial spin labeling techniques for quantitative perfusion imaging." Magnetic Resonance in Medicine 40.3 (1998): 348-355.

Xu, Jungian, et al., "Evaluation of slice accelerations using multiband echo planar imaging at 3T." Neuroimage 83 (2013): 991-1001.

\* cited by examiner

TIME EFFICIENT ASL IMAGING WITH SEGMENTED MULTIBAND ACQUISITION

CROSS-REFERENCE TO RELATED APPLICATIONS

This application claims the benefit of U.S. Provisional Application Ser. No. 62/102,789 filed Jan. 13, 2015, which is incorporated herein by reference in its entirety.

GOVERNMENT INTERESTS

This invention was made with government support under P41EB015894 and UL1TR000114 awarded by the National Institutes of Health. The government has certain rights in the invention.

TECHNOLOGY FIELD

The present invention relates generally to methods, systems, and apparatuses for performing ASL imaging using a segmented multi-band acquisition technique to provide higher spatial and temporal perfusion signal-to-ratio (SNR) efficiencies across the whole brain compared to performing either a single single-band or a single multi-band acquisition individually. Using the techniques described herein, a multi-band (MB)-EPI acquisition method can be applied for each divided region of the brain with small MB factors.

BACKGROUND

Arterial spin labeling (ASL) perfusion imaging makes use of arterial blood water as an endogenous tracer to estimate tissue perfusion and evaluate tissue viability. The non-invasive and non-contrast enhanced characteristics of ASL imaging make it an attractive approach for both neuroscience research and clinical applications. High-resolution studies are desired in order to reduce partial volume effects on cerebral blood flow (CBF) quantification, increase the ability to identify small focal lesions and improve perfusion quantification in small sub-cortical structures such as the hippocampus.

Obtaining high-resolution ASL based perfusion measurements is challenging due to the intrinsically low signal-to-noise ratio (SNR) and increased acquisition times when using standard acquisition strategies. Decreased perfusion SNR for high-resolution imaging is a consequence of multiple factors including increased in-plane resolution, increased through-plane resolution, and the need for more slices to cover the same volume resulting in prolonged delay times between labeling and signal acquisition during which labeled spins experience longitudinal relaxation. The necessity of increasing the number of label/control image pairs for sufficient perfusion SNR greatly increases the total imaging acquisition time, thus limiting, if not prohibiting, the practice of acquiring high-resolution whole brain ASL perfusion data. To overcome such challenges, different strategies have been previously proposed to increase perfusion SNR including continuous arterial spin labeling (CASL), pulsed arterial spin labeling (PASL), and pulsed- or pseudo-continuous arterial spin labeling (pCASL).

Multi-band imaging, or simultaneous multi-slice imaging, offers another solution to reduce the total acquisition time of high-resolution whole brain imaging with 2D echo planar imaging (EPI), especially when increased spatial or temporal resolution is desired. Multi-band EPI (MB-EPI) uses multi-banded radio frequency (RF) pulses to simultaneously excite multiple spatially distributed slices, where the superimposed signals acquired from the multiple slices are unwrapped via anti-aliasing reconstruction. The simultaneous acquisition of multiple slices can greatly reduce total imaging acquisition time for whole brain applications with EPI, and particularly has the potential to improve whole brain ASL perfusion studies where high in-plane and through-plane resolution is desired, necessitating the use of a large number of thin imaging slices to achieve the desired coverage.

Despite the general benefits of MB-EPI, SNR efficiencies in the inferior brain region are comparable to that of perfusion imaging using single-band (SB) EPI even when high multi-band (MB) acceleration factors are used. The lack of improvement in the inferior brain region with MB-EPI ASL imaging results from the requirement for a sufficiently long post-labeling delay (PLD) with whole brain ASL imaging. In MB-EPI ASL whole brain imaging, imaging slices are acquired in a spatially interleaved fashion. Therefore, to allow labeled blood spins a sufficient time to travel down to arterioles or the capillary bed and avoid intravascular artifacts in brain regions with the longest arterial transit times, an adequately long PLD, such as 1.6 s, must be used. In contrast, in whole brain SB-EPI ASL imaging, the ascending slice acquisition order permits the use of a PLD, such as 1.1 s, shorter than that needed for MB-EPI while avoiding potential intravascular artifacts as the arterial transit time monotonically increases with each sequentially acquired slice from inferior to superior. However, as the resolution increases, the resulting delay time in the more superior regions with SB-EPI is much longer than necessary to avoid intravascular artifacts at great cost to spatial and temporal perfusion SNR efficiency.

Accordingly, it is desired to create a technique, which can take advantage of the small arterial transit time in the inferior brain and use a short PLD for the acquisition of inferior imaging slice as in a single-band EPI ASL imaging, while applying a long PLD for the acquisition of the rest slices covering the middle and superior brain region in order to maximize ASL imaging SNR efficiency.

SUMMARY

Embodiments of the present invention address and overcome one or more of the above shortcomings and drawbacks, by providing methods, systems, and apparatuses related to a technique for time efficient ASL imaging with segmented multi-band acquisition (TEAISM). Briefly, TEAISM combines two or more multi-band (MB) EPI acquisitions to allow different regions of an anatomical region of interest to be optimally imaged within a single acquisition.

The two sets of slices can be efficiently acquired by a segmented MB-EPI readout with one segment for the inferior brain utilizing one MB factor and another segment for the rest of brain region using another MB factor. For example, for brain imaging, a SB EPI acquisition may be performed for slices covering the inferior region of the brain, while an MB EPI acquisition may be performed for slices covering the middle and superior regions of the brain. The combination of SB and MB EPI acquisitions results in higher spatial and temporal perfusion SNR efficiencies across the whole brain compared to a single SB or MB acquisition. Although the benefits of such a technique are illustrated herein by using a SB-EPI for the inferior brain region and an MB-EPI for the rest of the brain in an ASL imaging with a 2.5×2.5×3.0 mm³ resolution, it is worth noting that in an ASL imaging with even higher imaging resolution (e.g., as 2×2×2 mm³), an MB-EPI acquisition (such as MB-EPI with an MB factor 2) may be utilized to shorten the total acquisition time for increased number of inferior imaging slices and therefore to finish the data acquisition before the MB-EPI acquisition of the rest of the brain at the optimal PLD (e.g., 1.6 s).

According to some embodiments of the present invention, a method for generating a perfusion weighted image using arterial spin labeling with segmented acquisitions includes dividing an anatomical area of interest into a plurality of slices and performing an EPI acquisition process using an MRI system to acquire a control image dataset representative of the plurality of slices. An ASL preparation process is performed, using the MRI system to magnetically label protons in arterial blood water in an area upstream from the anatomical area of interest. For example, where the anatomical area of interest is the brain, the upstream area comprises neck vessels. The ASL preparation process may be performed using, for example, a continuous labeling technique, pseudo-continuous labeling technique, pulsed labeling technique, or velocity-selective arterial spin labeling technique. Following a first post-labeling delay time period, a multi-band EPI acquisition process is performed using the MRI system to acquire a first labeled image dataset representative of a first subset of the plurality of slices. Following a second post-labeling delay time period, another multi-band EPI acquisition process is performed using the MRI system to acquire a second labeled image dataset representative of a second subset of the plurality of slices. A perfusion weighted image of anatomical area of interest is generated by subtracting the first labeled image dataset and the second labeled image dataset from the control image dataset.

In some embodiments, the method is repeated multiple times to generate a plurality of perfusion weighted images of an anatomical area of interest which are averaged to yield a final perfusion weighted image. A perfusion quantification model may be applied to the final perfusion weighted image to obtain a quantitative mapping of cerebral blood flow (CBF) through tissue in the anatomical area of interest.

Various other additional enhancements, additions, or modifications may be made to the aforementioned method in different embodiments. For example, in some embodiments, the method further comprises identifying the first subset of the plurality of slices based on one or more anatomical features of the anatomical area of interest. In some of these embodiments, the anatomical area of interest is a brain and the one or more anatomical features identify an inferior region of the brain. In other embodiments, identifying the second subset of the plurality of slices is identified based on one or more anatomical features of the anatomical area of interest. In some of these embodiments, the anatomical area of interest is a brain and the one or more anatomical features identify at least one of a middle region of the brain or a superior region of the brain.

According to other embodiments of the present invention, a second method for performing arterial spin labeling with segmented acquisitions includes using an MRI system to magnetically label protons in arterial blood water in an area upstream from an anatomical area of interest. Following a first post-labeling delay time period, a multi-band EPI acquisition process is performed using the MRI system to acquire a first labeled image dataset representative of a first portion of the anatomical area of interest (an inferior region of the brain). Following a second post-labeling delay time period, another multi-band EPI acquisition process is performed using the MRI system to acquire a second labeled image dataset representative of a second portion of the anatomical area of interest (e.g., a middle and/or superior region of the brain).

In some embodiments of this second method, an image is generated using the first labeled image dataset and the second labeled image dataset. For example, in one embodiment, an EPI acquisition process is performed using the MRI system to acquire a control image dataset representative of the anatomical area of interest. The image may be a diffusion weighted image generated by subtracting the first labeled image dataset and the second labeled image dataset from a corresponding control image dataset. The method may be repeated a plurality of times to generate multiple perfusion weighted images of an anatomical area of interest which are averaged to yield a final perfusion weighted image. A perfusion quantification model may be applied to the final perfusion weighted image to obtain a quantitative mapping of CBF through tissue in the anatomical area of interest.

According to other embodiments of the present invention, a system for performing arterial spin labeling with segmented acquisitions includes a magnetic field generator comprising a plurality of coils and a central control computer. The central control computer is configured to use the plurality of coils to magnetically label protons in arterial blood water in an area upstream from an anatomical area of interest. Following a first post-labeling delay time period, the central control computer uses the coils to acquire a first labeled image dataset representative of a first portion of the anatomical area of interest using a multi-band EPI acquisition process. Following a second post-labeling delay time period, the central control computer uses the coils to acquire a second labeled image dataset representative of a second portion of the anatomical area of interest using an additional multi-band EPI acquisition process. In some embodiments, the central control computer is further configured to use the coils to acquire a control image dataset representative the anatomical area of interest; and generate a perfusion weighted image of anatomical area of interest by subtracting the first labeled image dataset and the second labeled image dataset from the control image dataset.

Additional features and advantages of the invention will be made apparent from the following detailed description of illustrative embodiments that proceeds with reference to the accompanying drawings.

BRIEF DESCRIPTION OF THE DRAWINGS

The foregoing and other aspects of the present invention are best understood from the following detailed description when read in connection with the accompanying drawings. For the purpose of illustrating the invention, there is shown in the drawings embodiments that are presently preferred, it being understood, however, that the invention is not limited to the specific instrumentalities disclosed. Included in the drawings are the following Figures.

DETAILED DESCRIPTION OF ILLUSTRATIVE EMBODIMENTS

The following disclosure describes the present invention according to several embodiments directed at methods, systems, and apparatuses related to segmented multi-band image acquisition. The disclosed acquisition strategy, referred to herein as Time Efficient ASL Imaging with Segmented Multiband acquisition (TEAISM) divides imaging slices into a plurality of slice groups. Then, each group of slices are acquired using a multi-band echo planar imaging (MB-EPI) using a different PLD. The MB-EPI acquisition may be performed using a multi-band (MB) factor (i.e., slice acceleration factor) smaller than the MB factor used in whole brain acquisition when conventional MB-EPI techniques are employed, and the single-band echo planar imaging (SB-EPI) can be considered as the reduced form of MB-EPI with an MB factor equal to 1. The techniques described herein are explained with reference to their use in Arterial Spin Labeling (ASL) imaging applications. In contrast to existing ASL acquisition techniques, the segmented MB readouts described herein may be applied to image the inferior, middle and superior brain region separately within a single whole brain acquisition, instead requiring a single MB readout. Additionally, TEAISM can provide extra benefits for ASL imaging by further boosting spatial and temporal perfusion SNR efficiencies, reducing overall imaging time, and minimizing leakage contamination levels which, in turn, increases temporal SNR efficiency.

Figure 1:
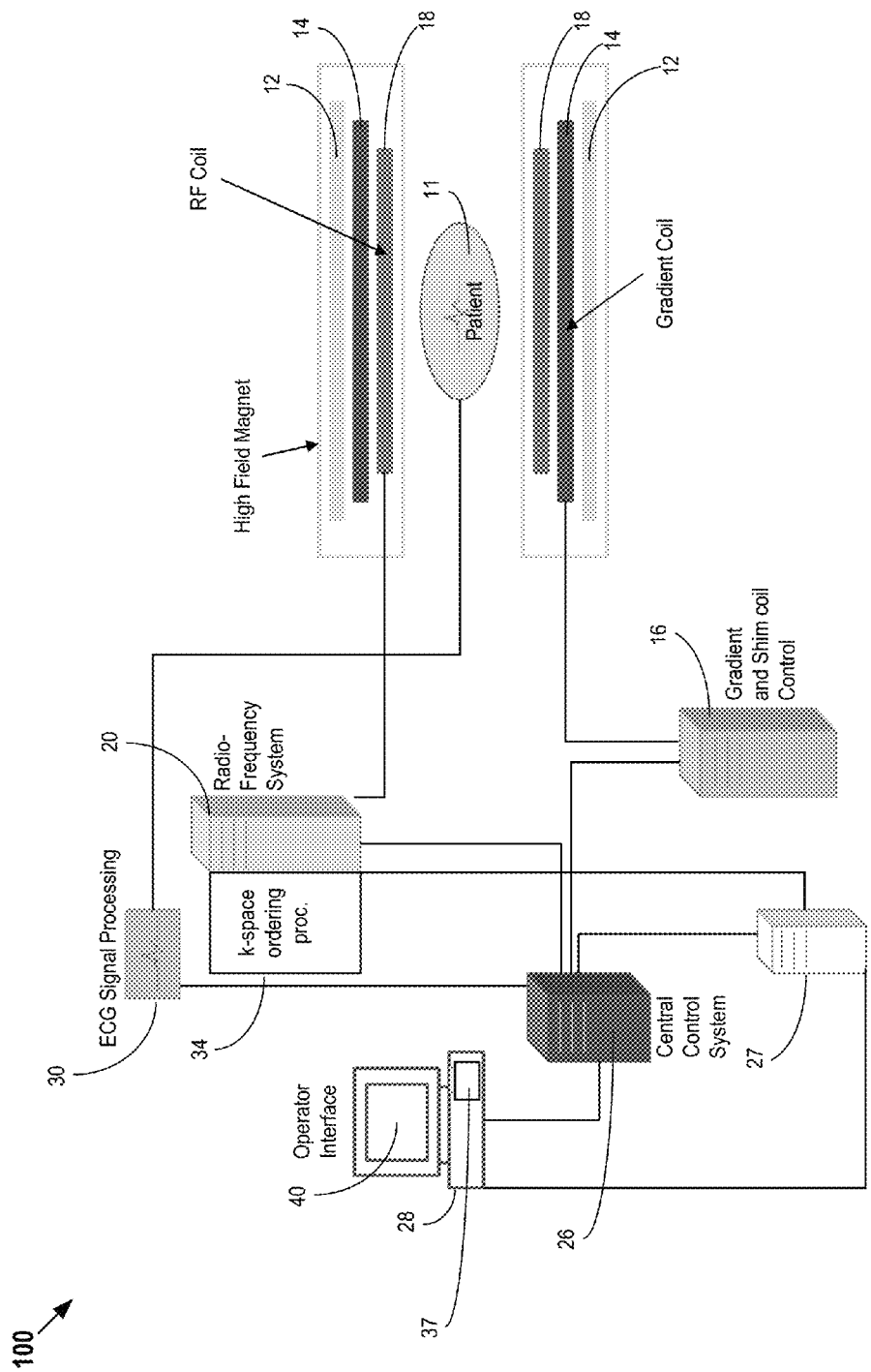
FIG. 1 shows a system for ordering acquisition of frequency domain components representing magnetic resonance image data for storage in a k-space storage array, as used by some embodiments of the present invention.

FIG. 1 shows a system 100 for ordering acquisition of frequency domain components representing MRI data for storage in a k-space storage array, as used by some embodiments of the present invention. In system 100, magnetic coils 12 create a static base magnetic field in the body of patient 11 to be imaged and positioned on a table. Within the magnet system are gradient coils 14 for producing position dependent magnetic field gradients superimposed on the static magnetic field. Gradient coils 14, in response to gradient signals supplied thereto by a gradient and shim coil control module 16, produce position dependent and shimmed magnetic field gradients in three orthogonal directions and generates magnetic field pulse sequences. The shimmed gradients compensate for inhomogeneity and variability in an MRI device magnetic field resulting from patient anatomical variation and other sources. The magnetic field gradients include a slice-selection gradient magnetic field, a phase-encoding gradient magnetic field and a readout gradient magnetic field that are applied to patient 11.

Further radio frequency (RF) module 20 provides RF pulse signals to RF coil 18, which in response produces magnetic field pulses which rotate the spins of the protons in the imaged body of the patient 11 by ninety degrees or by one hundred and eighty degrees for so-called "spin echo" imaging, or by angles less than or equal to 90 degrees for so-called "gradient echo" imaging. Gradient and shim coil control module 16 in conjunction with RF module 20, as directed by central control unit 26, control slice-selection, phase-encoding, readout gradient magnetic fields, radio frequency transmission, and magnetic resonance signal detection, to acquire magnetic resonance signals representing planar slices of patient 11.

In response to applied RF pulse signals, the RF coil 18 receives magnetic resonance signals, i.e., signals from the excited protons within the body. The magnetic resonance signals are detected and processed by a detector within RF module 20 and k-space component processor unit 34 to provide a magnetic resonance dataset to an image data processor for processing into an image. In some embodiments, the image data processor is located in central control unit 26. However, in other embodiments such as the one depicted in FIG. 1, the image data processor is located in a separate unit 27. Electrocardiogram (ECG) synchronization signal generator 30 provides ECG signals used for pulse sequence and imaging synchronization. A two or three dimensional k-space storage array of individual data elements in k-space component processor unit 34 stores corresponding individual frequency components for a given time step comprising a magnetic resonance dataset. The k-space array of individual data elements has a designated center and individual data elements individually have a radius to the designated center.

A magnetic field generator (comprising coils 12, 14, and 18) generates a magnetic field for use in acquiring multiple individual frequency components corresponding to individual data elements in the storage array. The individual frequency components are successively acquired in an order in which radius of respective corresponding individual data elements increases and decreases along a trajectory path (e.g., a spiral path) as the multiple individual frequency components are sequentially acquired during acquisition of a magnetic resonance dataset representing a magnetic resonance image. A storage processor in the k-space component processor unit 34 stores individual frequency components acquired using the magnetic field in corresponding individual data elements in the array. The radius of respective corresponding individual data elements alternately increases and decreases as multiple sequential individual frequency components are acquired. The magnetic field acquires individual frequency components in an order corresponding to a sequence of substantially adjacent individual data elements in the array and the magnetic field gradient change between successively acquired frequency components is substantially minimized.

Central control unit 26 uses information stored in an internal database to process the detected magnetic resonance signals in a coordinated manner to generate high quality images of a selected slice(s) of the body (e.g., using the image data processor) and adjusts other parameters of system 100. The stored information comprises predetermined pulse sequence and magnetic field gradient and strength data as well as data indicating timing, orientation and spatial volume of gradient magnetic fields to be applied in imaging. Generated images are presented on display 40 of the operator interface. Computer 28 of the operator interface includes a graphical user interface (GUI) enabling user interaction with central control unit 26 and enables user modification of magnetic resonance imaging signals in substantially real time. Continuing with reference to FIG. 1, display processor 37 processes the magnetic resonance signals to reconstruct one or more images for presentation on display 40, for example. Various techniques generally known in the art may be used for reconstruction. For example, in some embodiments, an optimization algorithm is applied to iteratively solve a cost function which results in the reconstructed image.

Using the TEAISM techniques described herein, the system 100 shown in FIG. 1 may be used to perform an EPI image acquisition which combines the benefits of conventional SB and MB acquisitions. Briefly, acquisition of slices covering a region of interest is divided into two or more separate acquisitions. This allows SB acquisition techniques to be targeted for certain areas of the anatomy, while MB acquisition techniques may be used for other areas. Additionally, where MB is employed, a relatively low MB factor may be used in comparison to conventional MB acquisition techniques. The techniques described herein are explained with reference to their use in ASL imaging applications. In contrast to existing ASL acquisition techniques, the segmented MB readouts described herein may be applied to image the inferior, middle and superior brain region separately during a single whole brain acquisition, instead requiring a single MB readout. Additionally, TEAISM can provide extra benefits for ASL imaging by further boosting spatial and temporal perfusion SNR efficiencies, reducing overall imaging time, and minimizing leakage contamination levels which, in turn, increases temporal SNR efficiency.

Figure 2:
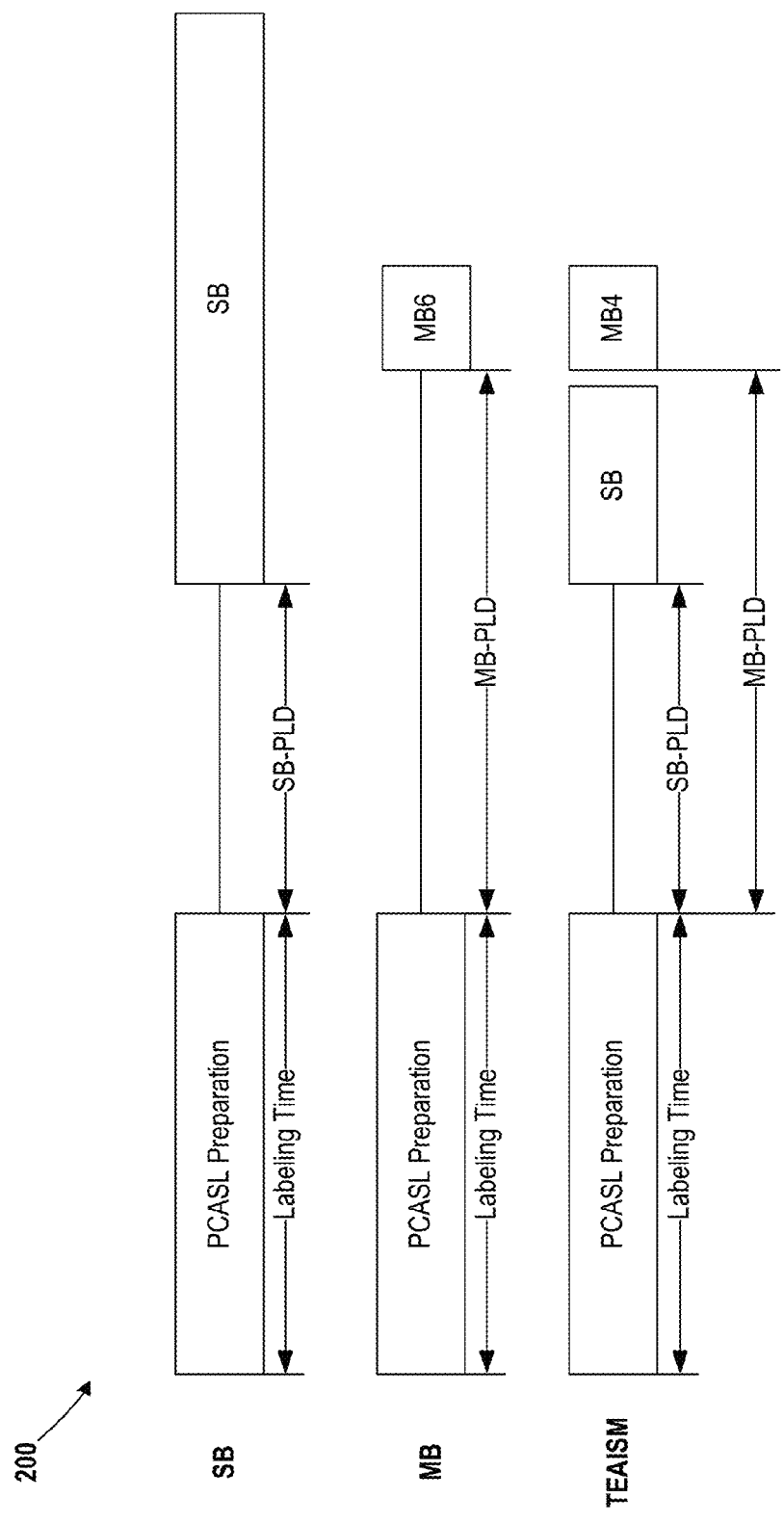
FIG. 2 presents sequence diagrams for high-resolution whole brain pCASL imaging using three different acquisition strategies: SB, MB with factor 6, and TEAISM using SB for inferior slices and MB with factor 4 for other slices.

FIG. 2 presents example sequence diagrams 200 for high-resolution whole brain pCASL imaging using three different acquisition strategies: SB, MB with factor 6, and TEAISM using SB for inferior slices and MB with factor 4 for other slices, according to some embodiments. Initially, each acquisition strategy performs a preparation step during which arterial blood water is magnetically "labeled" using radio frequency (RF) pulses. After labeling, a post-labeling delay (PLD) is introduced to allow magnetically-labeled blood water to flow into the microvasculature and tissue. The three acquisition strategies differ in the length of the PLD. For the SB case, the PLD for the whole brain SB-EPI pCASL imaging is referred to as "SB-PLD." This time may be, for example, on the order of 1.1 s. For the MB acquisition strategy, an MB factor of 6 is used and the whole brain PLD is slightly longer (e.g., 1.6 seconds).

Continuing with reference to FIG. 2, the TEAISM acquisition strategy combines the two acquisition strategies by portioning the brain into SB and MB acquisitions, each with a different PLD value. Thus, the inferior brain region can be acquired by using SB-EPI with the PLD for whole brain SB-EPI pCASL imaging. Slices in middle and superior brain regions can be acquired by using a small MB factor (e.g., 4) with the proper PLD used in whole brain acquisition using a single MB-EPI acquisition with the proper MB-PLD for these brain regions.

Figure 3A:
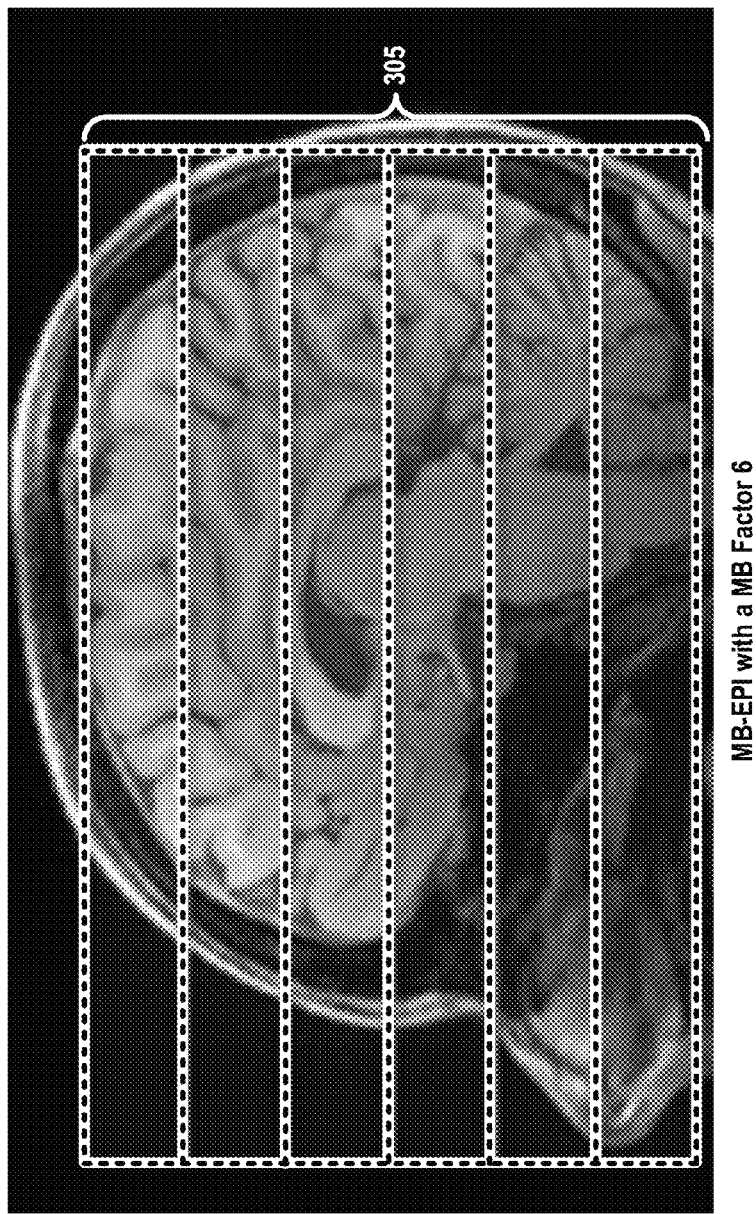
FIG. 3A shows an MB acquisition with a MB factor of 6.
Figure 3B:
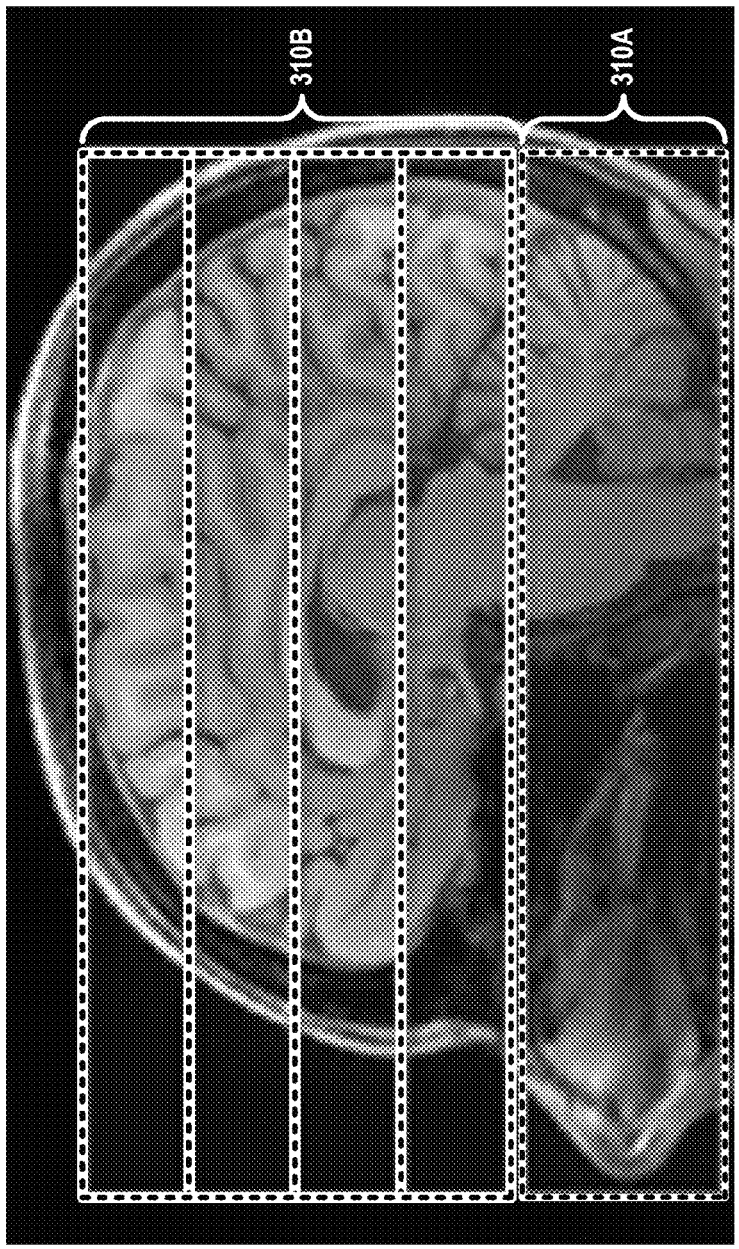
FIG. 3B shows a TEAISM acquisition, performed according to some of the embodiments of the present invention.
Figure 3B:
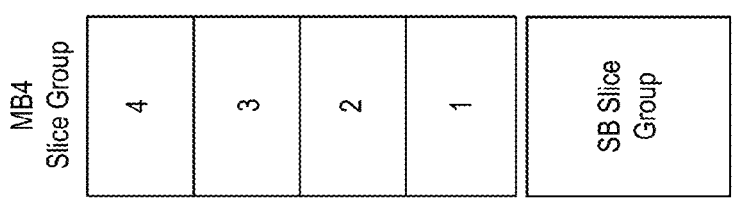

The differences between the MB and TEAISM acquisition strategy presented in FIG. 2 are further illustrated in FIGS. 3A and 3B. Specifically, FIG. 3A shows the MB acquisition with an MB factor of 6. The image on the right shows that six slices provide coverage over the entire brain region 305 uniformly. Conversely, in FIG. 3B the inferior brain region 310A is acquired using a SB-EPI acquisition. Then, the middle and superior brain regions 310B are acquired with an MB acquisition with an MB factor of 4.

Figure 4:
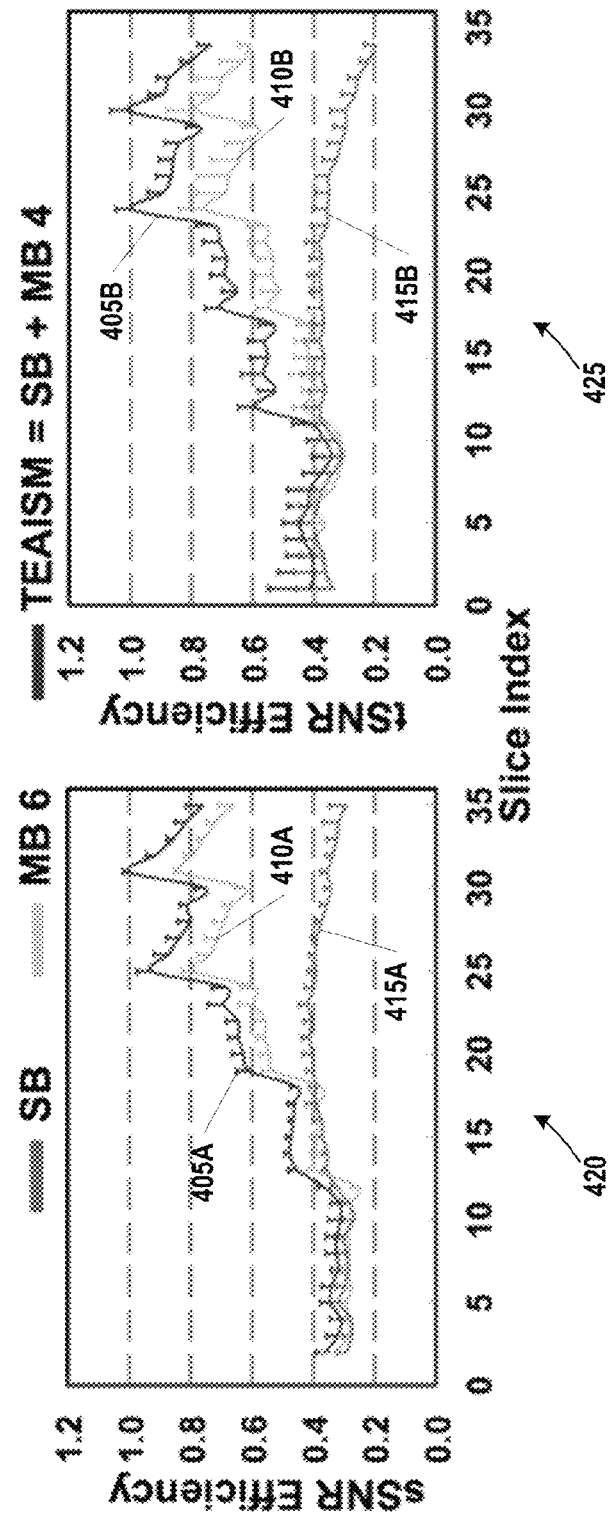
FIG. 4 provides two plots which show the measurements of perfusion SNR efficiencies for high-resolution whole brain pCASL imaging using SB-EPI, MB-EPI with an MB factor 6, and TEAISM using SB-EPI for inferior 12 slices and MB-EPI with an MB factor 4 for rest 24 slices.

FIG. 4 provides two plots 420 and 425 which illustrate the measurements of perfusion SNR efficiencies for high-resolution whole brain pCASL imaging using SB-EPI, MB-EPI with an MB factor 6, and TEAISM using SB-EPI for inferior 12 slices and MB-EPI with an MB factor 4 for the remaining 24 slices. In the plots 420 and 425, the SB results are shown in curves 415A and 415B, while the MB 6 results are shown in plots 410A and 410B. The TEAISM results are presented in curves 405A and 405B. These plots 420 and 425 show that TEAISM provides significantly better SNR results than the convention SB and MB techniques.

Figure 5:
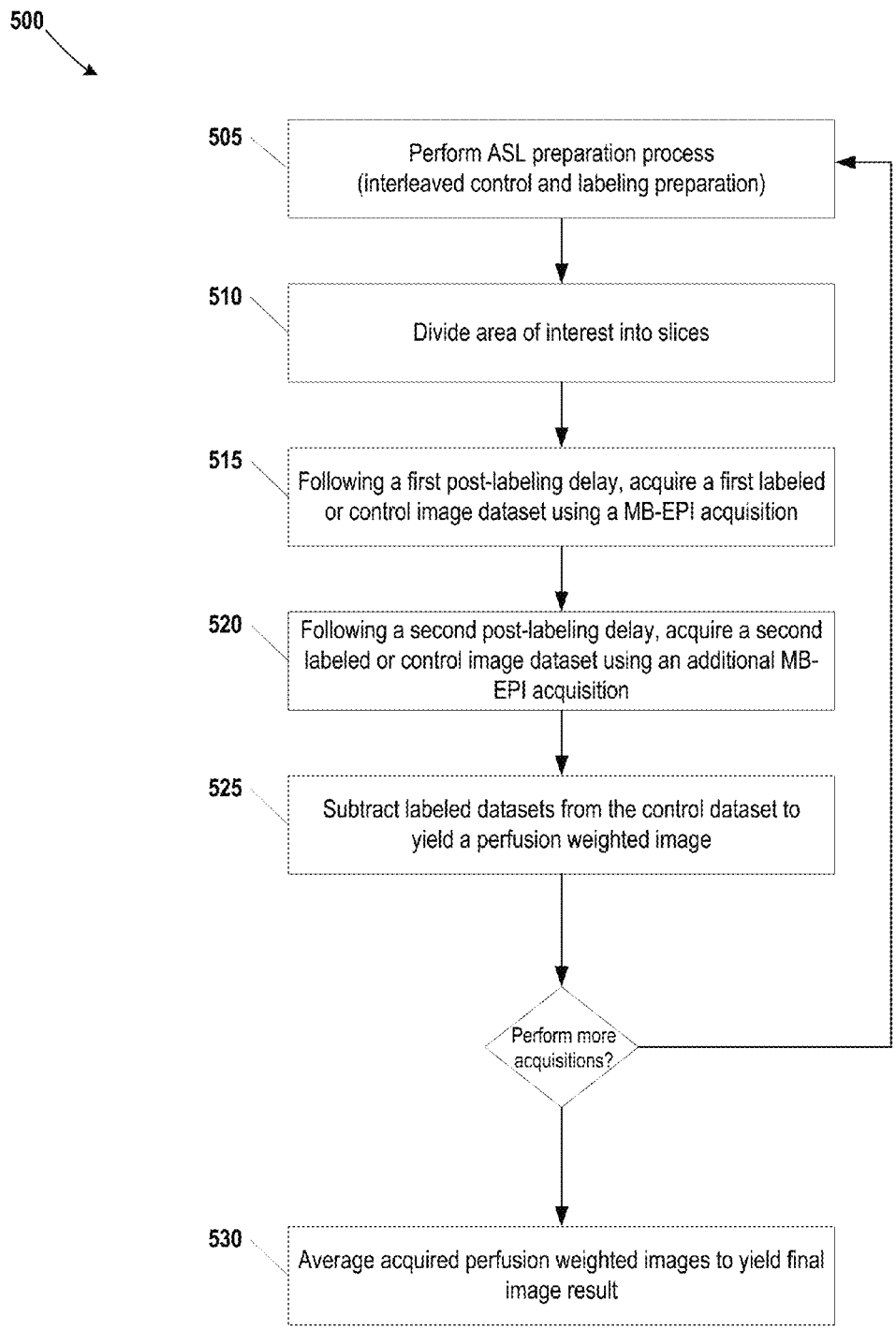
FIG. 5 provides a flow chart illustrating how TEAISM may be used to generate a perfusion weighted image, according to some embodiments.

FIG. 5 provides a flow chart 500 illustrating how TEAISM may be used to generate a perfusion-weighted image, according to some embodiments. As is understood in the art, perfusion-weighted images provide a graphical depicting of the perfusion of blood through tissue. Starting at step 505, an ASL preparation process is performed by using the MRI system to apply RF pulses to a region upstream from the area being imaged. For example, where the anatomical area of interest is the brain the area upstream from the anatomical area of interest comprises neck vessels. The ASL preparation process provides two types of imaging preparations in an interleaved fashion: control and labeling imaging preparations. In control imaging preparation, the ASL preparation module will not label upstream arterial blood, while in labeling imaging preparation, the upstream arterial blood will be magnetically labeled. Next, at step 510, an anatomical area of interest is divided into a plurality of slices. The exact number of slices may vary depending on the capabilities of the MRI system hardware and the particular anatomy being imaged.

Continuing with reference to FIG. 5, following a first time delay, a first labeled/control image dataset is acquired at 515 using a MB-EPI acquisition process (or SB-EPI when the MB factor equal to 1 is used). This first labeled/control image dataset corresponds to a subset of the plurality of images. The particular subset acquired may be selected based on features of the anatomical area of interest. For example, for brain imaging, these features may be associated with the inferior region of the brain. Following a second time delay, another MB-EPI acquisition process is applied at step 520 to acquire a second labeled/control image dataset. This second labeled/control image dataset comprise a second subset of the plurality of slices (e.g., the remaining slices that were not acquired at step 515). As with the slices acquired at step 515, the slices acquired at step 520 may also be identified based on anatomical features (e.g., features indicative of a middle and/or superior region of the brain). Then, at step 525, the labeled image datasets are subtracted from the control image dataset to yield a perfusion-weighted image.

The difference between the labeled and control image datasets may be small. Thus, to ensure that an adequate SNR is achieved, steps 505-525 may be repeated multiple times. Then, at step 530, the perfusion-weighted images are averaged to yield a final image result. This final image result (and/or any of the intermediary perfusion weighted images) may be displayed on a graphical user interface (GUI) for presentation to a user. In some embodiments, a perfusion quantification model is then applied to the final image to obtain a quantitative mapping of cerebral blood flow (CBF) through tissue in the anatomical area of interest. This mapping may similarly be presented in the aforementioned GUI.

Compared to the use of a single MB-EPI acquisition for whole brain imaging, the TEAISM approach can provide extra benefits for ASL imaging by further boosting spatial and temporal perfusion SNR efficiencies, therefore reducing needed total imaging time and eliminating or further minimizing leakage contamination levels and therefore increasing temporal SNR efficiency as described in detail in the following.

First, g-factor penalty is reduced over the whole brain. In the inferior brain region, there will be no g-factor penalty when SB-EPI is used for data acquisition or reduced g-factor penalty when MB-EPI with a smaller MB factor is employed. Similarly, due to the use of smaller MB factor in the MB-EPI acquisition for slices covering the middle and superior brain regions, g-factor penalty will be also reduced.

Secondly, imaging repetition time is maintained or further reduced. Since the PLD for middle and superior brain regions should be no less than 1.6 s (MB-PLD) to avoid intravascular artifacts, data acquisition for inferior imaging slices with SB-EPI or MB-EPI with a smaller MB factor (e.g., 2) can be gracefully finished during PLDs between SB-PLD (1.1 s) to MB-PLD (1.6 s), resulting no time penalty. Furthermore, even though a smaller MB factor (e.g., 4) will be used for MB acquisition of slices in the middle and superior brain regions, due to the reduced number of slices, the repetition time can at least remain equal to that used in whole brain imaging with a single MB acquisition.

Third, the level of total leakage contamination across the brain may be minimized or avoided altogether. The use of smaller MB factors for separate MB-EPI acquisitions of inferior slices and the rest of slices will minimize leakage contaminations across the whole brain. Particularly, when SB-EPI is used for the acquisition of inferior slices, there will be no leakage contamination at all. Minimized leakage contamination will result in increased temporal SNR.

The overall net effect of these three benefits will be higher spatial and temporal perfusion SNR efficiency across the whole brain compared to a single MB-EPI or SB-EPI acquisition method. Another potential benefit will be minimized magnetization transfer (MT) effects due to the reduced number of simultaneously applied off-resonance RF pulses experienced by each slice.

Although the TEAISM techniques are described herein with a reference to using CASL, pCASL and PASL methods in the brain, they are not limited as such. In general, TEAISM may be applied to any imaging methods based on ASL technique including, for example, techniques based on flow-sensitive alternating inversion recovery (FAIR) or velocity-selective arterial spin labeling (VS-ASL). Additionally, TEAISM may be extended to newer imaging methods based on ASL principles including, without limitation, digital subtraction angiography (DSA), time-resolved or 4D angiography, vascular permeability by combining diffusion-weighting for labeled arterial blood, cerebral blood volume (CBV), and cerebral metabolic rate of oxygenation ($CMRO_2$). Although demonstrated in the brain and using the MB-EPI as the readout, the described techniques may also be applicable to other body regions or organs (e.g., kidneys), as well as other MB imaging readout methods, such as multi-band gradient recalled echo (MB-GRE).

The embodiments of the present disclosure may be implemented with any combination of hardware and software. In addition, the embodiments of the present disclosure may be included in an article of manufacture (e.g., one or more computer program products) having, for example, computer-readable, non-transitory media. The media has embodied therein, for instance, computer readable program code for providing and facilitating the mechanisms of the embodiments of the present disclosure. The article of manufacture can be included as part of a computer system or sold separately.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters.

A graphical user interface (GUI), as used herein, comprises one or more display images, generated by a display processor and enabling user interaction with a processor or other device and associated data acquisition and processing functions. The GUI also includes an executable procedure or executable application. The executable procedure or executable application conditions the display processor to generate signals representing the GUI display images. These signals are supplied to a display device which displays the image for viewing by the user. The processor, under control of an executable procedure or executable application, manipulates the GUI display images in response to signals received from the input devices. In this way, the user may interact with the display image using the input devices, enabling user interaction with the processor or other device.

The functions and process steps herein may be performed automatically or wholly or partially in response to user command. An activity (including a step) performed automatically is performed in response to one or more executable instructions or device operation without user direct initiation of the activity.

In the present application, the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

The system and processes of the figures are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. As described herein, the various systems, subsystems, agents, managers and processes can be implemented using hardware components, software components, and/or combinations thereof No claim element herein is to be construed under the provisions of 55 U.S.C. 112, sixth paragraph, unless the element is expressly recited using the phrase "means for."

We claim:

1. A method for generating a perfusion weighted image using arterial spin labeling (ASL) with segmented acquisitions, the method comprising:
   dividing an anatomical area of interest into a plurality of slices;

performing an echo planar imaging (EPI) acquisition process using a magnetic resonance imaging (MRI) system to acquire a control image dataset representative of the plurality of slices;

performing an ASL preparation process, using the MRI system to magnetically label protons in arterial blood water in an area upstream from the anatomical area of interest;

following a first post-labeling delay time period, performing a multi-band (MB) EPI acquisition process with a first MB factor using the MRI system to acquire a first labeled image dataset representative of a first subset of the plurality of slices;

following a second post-labeling delay time period, performing another MB EPI acquisition process with a second MB factor using the MRI system to acquire a second labeled image dataset representative of a second subset of the plurality of slices, wherein the second MB factor is higher than the first MB factor; and generating a perfusion weighted image of anatomical area of interest by subtracting the first labeled image dataset and the second labeled image dataset from the control image dataset.

2. The method of claim 1, further comprising:
identifying the first subset of the plurality of slices based on one or more anatomical features of the anatomical area of interest.

3. The method of claim 2, wherein the anatomical area of interest is a brain and the one or more anatomical features identify an inferior region of the brain.

4. The method of claim 1, further comprising:
identifying the second subset of the plurality of slices based on one or more anatomical features of the anatomical area of interest.

5. The method of claim 4, wherein the anatomical area of interest is a brain and the one or more anatomical features identify at least one of a middle region of the brain or a superior region of the brain.

6. The method of claim 1, wherein the anatomical area of interest is a brain and the area upstream from the anatomical area of interest comprises neck vessels.

7. The method of claim 1, wherein the method is repeated a plurality of times to generate a plurality of perfusion weighted images of anatomical area of interest which are averaged to yield a final perfusion weighted image.

8. The method of claim 7, further comprising:
applying a perfusion quantification model to the final perfusion weighted image to obtain a quantitative mapping of cerebral blood flow (CBF) through tissue in the anatomical area of interest.

9. The method of claim 1, wherein the ASL preparation process is performed using a continuous labeling technique or a pseudo-continuous labeling technique.

10. The method of claim 1, wherein the ASL preparation process is performed using a pulsed labeling technique.

11. The method of claim 1, wherein the ASL preparation process is performed using a velocity-selective arterial spin labeling technique.

12. A method for performing arterial spin labeling with segmented acquisitions, the method comprising:
using a magnetic resonance imaging (MRI) system to magnetically label protons in arterial blood water in an area upstream from an anatomical area of interest;
following a first post-labeling delay time period, performing a multi-band (MB) echo planar imaging (EPI) acquisition process with a first MB factor using the MRI system to acquire a first labeled image dataset representative of a first portion of the anatomical area of interest; and
following a second post-labeling delay time period, performing another MB EPI acquisition process with a second MB factor using the MRI system to acquire a second labeled image dataset representative of a second portion of the anatomical area of interest, wherein the second MB factor is higher than the first MB factor.

13. The method of claim 12, wherein the anatomical area of interest is a brain and the first portion of the anatomical area of interest corresponds to an inferior region of the brain.

14. The method of claim 13, wherein the second portion of the anatomical area of interest corresponds to at least one of a middle or superior region of the brain.

15. The method of claim 12, wherein the anatomical area of interest is a brain and the area upstream from the anatomical area of interest comprises neck vessels.

16. The method of claim 12, further comprising:
generating an image using the first labeled image dataset and the second labeled image dataset.

17. The method of claim 16, further comprising:
performing an EPI acquisition process using the MRI system to acquire a control image dataset representative of the anatomical area of interest,
wherein the image is a diffusion weighted image generated by subtracting the first labeled image dataset and the second labeled image dataset from a corresponding control image dataset.

18. The method of claim 17, wherein the method is repeated a plurality of times to generate a plurality of perfusion weighted images of anatomical area of interest which are averaged to yield a final perfusion weighted image.

19. The method of claim 18, further comprising:
applying a perfusion quantification model to the final perfusion weighted image to obtain a quantitative mapping of cerebral blood flow (CBF) through tissue in the anatomical area of interest.

20. A system for performing arterial spin labeling with segmented acquisitions, the system comprising:
a magnetic field generator comprising plurality of coils;
a central control computer configured to use the plurality of coils to:
magnetically label protons in arterial blood water in an area upstream from an anatomical area of interest,
following a first post-labeling delay time period, acquire a first labeled image dataset representative of a first portion of the anatomical area of interest using a multi-band (MB) echo planar imaging (EPI) acquisition process with a first MB factor, and
following a second post-labeling delay time period, acquire a second labeled image dataset representative of a second portion of the anatomical area of interest using an additional MB EPI acquisition process with a second MB factor, wherein the second MB factor is higher than the first MB factor.

21. The system of claim 20, wherein the central control computer is further configured to use the plurality of coils to:
acquire a control image dataset representative of the anatomical area of interest; and
generate a perfusion weighted image of anatomical area of interest by subtracting the first labeled image dataset and the second labeled image dataset from the control image dataset.

* * * * *